(12) United States Patent
Bailey et al.

(10) Patent No.: US 10,356,933 B2
(45) Date of Patent: Jul. 16, 2019

(54) MODULAR DATA CENTER WITH UTILITY MODULE

(71) Applicant: Dell Products L.P., Round Rock, TX (US)

(72) Inventors: Mark Mcgrath Bailey, Round Rock, TX (US); Trey S. Wiederhold, Cedar Park, TX (US); Ty R. Schmitt, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 365 days.

(21) Appl. No.: 15/182,409

(22) Filed: Jun. 14, 2016

(65) Prior Publication Data

US 2017/0359917 A1 Dec. 14, 2017

(51) Int. Cl.
*H05K 7/14* (2006.01)
*A62C 3/16* (2006.01)
*E04H 5/00* (2006.01)

(52) U.S. Cl.
CPC ......... *H05K 7/1492* (2013.01); *H05K 7/1485* (2013.01); *A62C 3/16* (2013.01); *E04H 2005/005* (2013.01)

(58) Field of Classification Search
None
See application file for complete search history.

(56) References Cited

U.S. PATENT DOCUMENTS

| 7,278,273 B1* | 10/2007 | Whitted | G06F 1/16 |
| | | | 361/690 |
| 8,839,569 B2 | 9/2014 | Crosby, Jr. | |
| 2008/0123288 A1* | 5/2008 | Hillis | H05K 7/1497 |
| | | | 361/679.34 |
| 2010/0223085 A1* | 9/2010 | Gauthier | G06F 1/182 |
| | | | 709/200 |
| 2010/0223858 A1 | 9/2010 | Billings | |
| 2012/0200206 A1* | 8/2012 | Schmitt | G06F 1/181 |
| | | | 312/107 |
| 2013/0094136 A1* | 4/2013 | Gross | G06F 1/20 |
| | | | 361/679.31 |
| 2014/0059945 A1 | 3/2014 | Gardner et al. | |
| 2014/0157692 A1* | 6/2014 | Parizeau | E04H 1/005 |
| | | | 52/173.1 |
| 2014/0268530 A1 | 9/2014 | Roy | |
| 2015/0295389 A1* | 10/2015 | Steeves | H02B 1/205 |
| | | | 361/624 |

* cited by examiner

*Primary Examiner* — Elias Mamo
(74) *Attorney, Agent, or Firm* — Norton Rose Fulbright US LLP (57) ABSTRACT

A data center may be organized into modules, wherein the modules are purchased pre-configured to provide certain functionality of an information handling system. The modules may include utility modules, information technology (IT) modules, and air handling unit (AHU) modules. The utility module may provide infrastructure for other modules, such as electrical power service infrastructure. Electrical power may be provided by the utility module to other modules through two or more redundant busses connected to different electrical sources. The utility module may also include a control system that allows the utility services to be reconfigured to allow installation of new modules without interrupting service to existing modules.

17 Claims, 7 Drawing Sheets

MODULAR DATA CENTER WITH UTILITY MODULE

CROSS-REFERENCE TO RELATED PATENT APPLICATIONS

This application is related by subject matter to U.S. patent application Ser. No. 15/182,534 filed Jun. 14, 2016 and entitled "Modular Data Center with Passively-Cooled Utility Module," which is incorporated by reference in its entirety.

FIELD OF THE DISCLOSURE

The instant disclosure relates to data centers. More specifically, portions of this disclosure relate to modular data centers.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Figure 1:
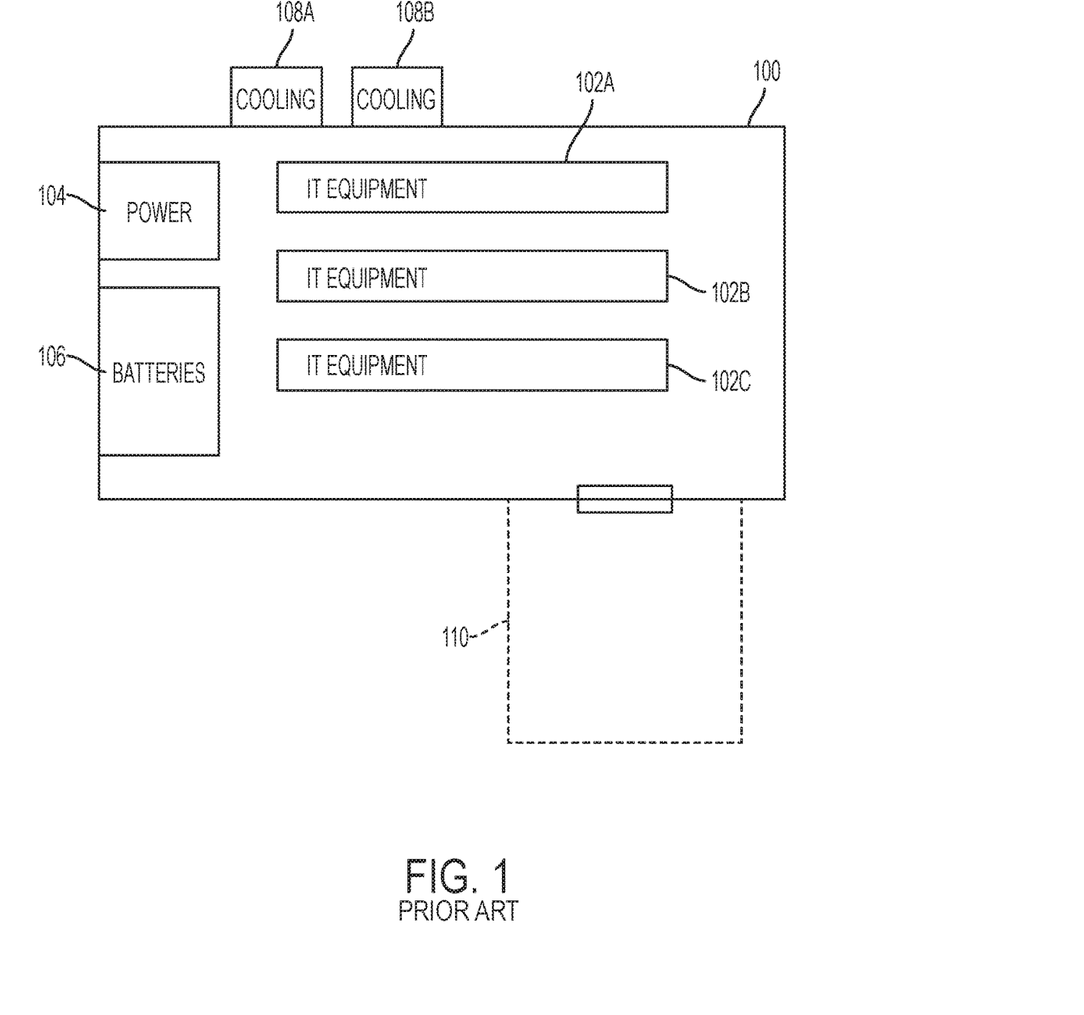
FIG. 1 is a block diagram illustrating a conventional equipment space for information handling systems.

The variety of hardware components that may be configured to operate as an information handling system are conventionally installed in dedicated information technology (IT) equipment space along with necessary support and backup systems. One such equipment space is outlined in FIG. 1. FIG. 1 is a block diagram illustrating a conventional equipment space for information handling systems. Equipment space 100 may include racks 102A, 102B, and 102C of information technology (IT) equipment. Support systems for the IT equipment may also be located in the equipment space 100, such as power subsystems 104 and backup batteries 106. The equipment space 100 also conventionally includes dedicated cooling units 108 (e.g., units 108A and 108B). The equipment space 100 is generally space set apart in a building or other location to be used for racks 102A, 102B, and 102C. A staging area 110 outside the building may be used for delivery of new IT equipment for installation into racks 102A, 102B, and 102C.

The arrangement of equipment space 100 and staging area 110 has drawbacks that are particularly disadvantageous with large scale and growing information handling systems. For example, when additional IT equipment is needed or desired to support additional information or users, the IT equipment is delivered to the staging area 110 by truck, and administrators then un-package and de-trash the IT equipment and install in the racks 102A, 102B, and 102C. The staging area 110 conventionally is an outdoor area or partially sheltered area that is not climate controlled and may be partially exposed to the elements. However, during un-packaging in staging area 110, the IT equipment may be exposed to the elements, such as cold, heat, rain, snow, ice, or high humidity. The elements may damage or shorten the life of the new IT equipment. For example, when there is a large temperature difference between outside and inside moving IT equipment into the equipment space 100 may cause condensation to form in the IT equipment. Further, when the administrators install new IT equipment in racks 102A, 102B, or 102C, the installation may cause interruptions to service provided by existing IT equipment. IT equipment often supports 24/7 operations within a business, and thus any interruption is undesirable and can impact the business.

During the electronic information era of the last few decades the amount of information being stored and processed has grown rapidly and continues to grow rapidly. Further, companies' reliance on information handling systems has increased such that interruptions in operations of the information handling systems can cripple the business. Not only are companies' own information handling systems growing rapidly, but new businesses have appeared whose sole service is to provide cloud computing or cloud storage. Such businesses are even less tolerant of IT equipment outage. Further, such businesses have more rapid growth that increases the frequency of installation of new IT equipment. With each new installation comes the increased possibility of an outage, because administrators are accessing shared space with existing IT equipment and may unintentionally interrupt operation of existing IT equipment.

SUMMARY

Information handling systems and supporting equipment may be organized as prefabricated infrastructure modules (PIM) for a data center. The prefabricated infrastructure module (PIM) or "modules" may be segmented portions of a data center, each performing one or more functions in support of the data center. The modules may be small and pre-configured to provide the functions to other modules in the modular data center with minimal administrator interaction or configuration. The modules may have external connections, such as through standardized ports, to allow the coupling of modules to other modules and through other modules to provide the functions to other modules. The modules may provide improved reliability of existing information technology (IT) equipment and provide for quicker installation of new IT equipment. Thus, information handling systems may be rapidly scaled in size by adding new modules with little or no effect on IT equipment in existing modules. Modules may be configured to interconnect to each other and share supporting equipment, such as power, security, control, fire suppression, and the like. One example module in a modular data center is an information technology (IT) module, which houses IT equipment such as computer systems and other equipment configured to store and/or process data. Another example module is an air handling unit (AHU) module, which may include mixing chambers, cooling systems, or conditioning systems to condition space within one or more IT modules. A further example module is a utility module, which may include supporting equipment, such as power systems, security systems, security systems, fire suppression systems, and/or control systems. In some embodiments, the utility module may include a staging area that allows administrators to store equipment to allow the equipment to become acclimated to the environment of the modules prior to unpackaging and de-trashing of the new IT equipment.

One arrangement of a modular information handling systems may include a utility module with connections configured to couple the utility module to one or more IT modules. For example, a mechanical connection may be provided to allow coupling of the IT module to the utility module. The mechanical connection may include other connections, such as electrical and communications wires that couple equipment within the utility module with equipment within the IT module. IT modules may include pre-installed and configured computer systems, such that the IT module may be connected to the utility module and switched on without tedious wiring efforts by an administrator. The IT modules may thus be delivered on-site by a truck and connected to existing equipment without specially-skilled IT workers.

A utility module may support connections to multiple IT modules and may include support equipment configured to support the installation of new IT modules without interrupting services provided to existing IT modules. The IT modules may also support connection of additional IT modules to existing IT modules, such that additional modules may be coupled to the utility module or IT module. For example, an air handling unit (ALU) module may be connected to an IT module to provide for conditioning of space within the IT module, such as by cooling air using evaporative cooling or direct cooling. ALU modules may be configured to condition air within multiple IT modules. Each of the different modules may be pre-configured with equipment such that modules may be coupled to each other and brought online with little or no additional effort by IT administrators.

In some embodiments of the utility module, the utility module may be passively cooled from AHU modules coupled to other modules. For example, an AHU module may be attached to an IT module, which is attached to a utility module. Rather than separately cool the utility module with a dedicated air handling unit, openings may be provided between the utility module and the IT module to allow airflow of conditioned air from the IT module to the utility module. In some embodiments, the openings may be positioned relative to warm and cold aisles of the IT module. Airflow through the utility module may be provided when one opening is positioned at a high pressure location or at a cold aisle of the IT module and another opening is positioned at a low pressure location or at a warm aisle of the IT module. Thus, conditioned air may be provided to the utility room. The openings may include dampers to allow control of airflow and thus to regulate conditions within the utility module separate from conditions in the IT module. The dampers may also be used to shut the openings when conditioning of space in the utility module is not required or desired.

In some embodiments of the utility module, the utility module may include electrical power service infrastructure for IT modules and/or other modules. The electrical power service may provide redundant power supplies to the IT modules to improve reliability. Further, the redundant power supplies may allow the addition of new IT modules without requiring the disconnection of power to existing IT modules. For example, IT modules may be coupled to two different power sources through two different buses. When a new IT module is installed, the power service may be reconfigured to disconnect one source such that one bus is de-energized. During this time, existing IT equipment may continue to operate from the second source and the second bus. The new IT module may be coupled to the first bus and then the first bus re-energized from the first power source. At this time, all IT equipment is on-line. The second source may then be disconnected such that the second bus is de-energized. All IT equipment may continue to operate from the first source and the first bus. The new IT module may then be coupled to the second bus and then the second bus re-energized from the second power source. At this time, all IT equipment is on-line and operating from redundant power supplies. Thus, some embodiments of the utility room with multiple redundant power supplies may allow installation of new IT modules without affecting existing IT modules, which allows for faster installation of new IT modules and thus faster increases in capacity of the information handling system.

According to one embodiment, an apparatus may include a first module, such as a utility module, having a first connection configured to couple the first module to a second module comprising information handling systems; a second connection configured to couple the first module to a third module comprising additional information handling systems; and/or utility infrastructure configured to provide utilities to the second module and the third module through the first connection and the second connection. The utility infrastructure may be configured to be reconfigurable such that at least one of the second module and the third module may be connected without interrupting operation of the other of the second module and the third module.

The utility infrastructure may include electrical power service infrastructure. The electrical power service infrastructure may include a first input node for a first electrical source; a second input node for a second electrical source; a first electrical bus configured to couple the second module and the third module to the first input node; a second electrical bus configured to couple the second module and the third module to the second input node; a first switch coupled to the first electrical bus and to the first input node; and/or a second switch coupled to the second electrical bus and to the second input node. A control unit may be provided to operate the electrical power service infrastructure. The control unit may be configured to support connecting of an additional module by performing steps including de-activating the first switch to de-energize the first electrical bus; coupling the third module to the first electrical bus; activating the first switch to energize the first electrical bus; de-activating the second switch to de-energize the second electrical bus; coupling the third module to the second electrical bus; and/or activating the second switch to energize the second electrical bus.

In certain embodiments, the first module may include access to at least one of the information handling systems and the additional information handling systems; a controlled space for staging new information handling systems for installation with at least one of the information handling systems and the additional information handling systems; a fire suppression system configured to couple to the second module and the third module; a low-voltage direct current (DC) control bus configured to couple to the second module and the third module; and/or a security system configured to couple to the second module and the third module.

According to another embodiment, an information handling system may include a plurality of modules including a first information technology (IT) module comprising equipment for information handling; an air handling unit (AHU) module coupled to the first information technology (IT) module; and/or a utility module. The utility module may include a first connection configured to couple the utility room to the first information technology (IT) module; a second connection configured to couple the utility room to a second information technology (IT) module; and/or a utility infrastructure configured to provide utilities to the first information technology (IT) module and the second information technology (IT) module through the first connection and the second connection, and wherein the utility infrastructure is configured to be reconfigurable such that at least one of the first information technology (IT) module and the second information technology (IT) module may be connected without interrupting operation of the other of the first information technology (IT) module and the second information technology (IT) module.

The utility infrastructure of the information handling system may include electrical power service infrastructure. The electrical power service infrastructure may include a first input node for a first electrical source; a second input node for a second electrical source; a first electrical bus configured to couple the second module and the third module to the first input node; a second electrical bus configured to couple the second module and the third module to the second input node; a first switch coupled to the first electrical bus and to the first input node; and/or a second switch coupled to the second electrical bus and to the second input node. A control unit may be provided to operate the electrical power service infrastructure. The control unit may be configured to support connecting of an additional module by performing steps including de-activating the first switch to de-energize the first electrical bus; coupling the third module to the first electrical bus; activating the first switch to energize the first electrical bus; de-activating the second switch to de-energize the second electrical bus; coupling the third module to the second electrical bus; and/or activating the second switch to energize the second electrical bus.

In certain embodiments, the utility module may include access to at least one of the information handling systems and the additional information handling systems; a controlled space for staging new information handling systems for installation with at least one of the information handling systems and the additional information handling systems; a fire suppression system configured to couple to the second module and the third module; a low-voltage direct current (DC) control bus configured to couple to the second module and the third module; and/or a security system configured to couple to the second module and the third module.

According to another embodiment, a method may include providing electrical power, by a power system in a utility module, to information handling systems in a first information technology (IT) module; receiving, by the utility module, an indication of installation of a second information technology (IT) module comprising additional information handling systems; and/or reconfiguring, by the utility module, the power system to support the second information technology (IT) module without interrupting power to the first information technology (IT) module. In some embodiments, the step of reconfiguring the power system may include de-activating the first switch to de-energize the first electrical bus; coupling the third module to the first electrical bus; activating the first switch to energize the first electrical bus; de-activating the second switch to de-energize the second electrical bus; coupling the third module to the second electrical bus; and/or activating the second switch to energize the second electrical bus. In certain embodiments, the step of providing electrical power comprises providing electrical power through two redundant electrical busses coupled to the first information technology (IT) module.

According to one embodiment, a utility module may be configured to couple to an information technology (IT) module, and the utility module may include a first opening providing air exchange with a first space of the information technology (IT) module; and/or a second opening providing air exchange with a second space, wherein the first opening and the second opening are configured to provide passive cooling of the utility module.

In certain embodiments, the first opening may be configured to provide air exchange with a cold aisle of the information technology (IT) module; the second opening may be configured to provide air exchange with a warm aisle of the information technology (IT) module; the first opening may be configured to receive cool air from a cooling system attached to the information technology (IT) module; the first opening may be configured to provide air exchange with an area of higher pressure of the information technology (IT) module; the second opening may be configured to provide air exchange with an area of lower pressure of the information technology (IT) module; the passive cooling may be provided by heat exchange resulting from airflow from the first opening to the second opening; and/or the utility module does not include a dedicated cooling system.

According to another embodiment, an information handling system may include an information technology (IT) module comprising equipment configured to perform information handling; an air handling module coupled to the information technology (IT) module and configured to condition space within the information technology (IT) module; and/or a utility module coupled to the information technology (IT) module. The utility module may include a first opening providing air exchange with a first space of the information technology (IT) module; and/or a second opening providing air exchange with a second space. The first opening and the second opening may be configured to provide passive cooling of the utility module.

According to a further embodiment, an apparatus may include an enclosed space for electrical components, wherein the electrical components generate heat that increases a temperature of the enclosed space. The enclosed space may include a first opening providing air exchange with a first space of an information technology (IT) module; and/or a second opening providing air exchange with a second space. The first opening and the second opening may be configured to provide passive cooling of the enclosed space.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

The components of an information handling system may be organized into modules for installation into a modular data center. For example, computer systems operating as servers that provide web-based services and storage, may be stored in information technology (IT) modules. In some embodiments, the IT modules may include pre-drilled holes for racks and pre-wired ports, such as Ethernet and power connections, for the computer systems. At least some racks and computer systems may be pre-installed in the configured modules upon delivery of the module, such that the module can be connected into the modular data center and the computer systems immediately operational. The holes and racks may also support the quick installation of additional racks and computer systems as needed by an administrator. The IT modules may also include equipment for interconnecting the servers and facilitating communication with the servers that provide the web-based services and storage. This additional equipment may include, for example, network switches, network routers, load-balancers, proxy servers, authentication servers, and the like. This additional equipment may provide interfaces for integrating modules for cooperative operation of the various modules. The IT modules may be connected to, or integrated with, other modules that provide other functionality, such as a utility module and an air handling unit (AHU) module to collectively provide a robust data center. By basing the data center in modules, multiple redundant modules may be coupled together that prevent failures within the modular data center from affecting overall operation. Not only may redundant functions be provided, but the modular nature of functions within the data center may allow rapid installation of additional and/or replacement modules to the data center, because the modules may be delivered to a site pre-configured for operation.

Physically, the modules may be configured similar to rooms, with four or more walls, a floor, and a ceiling. The modules may be configured to movement on tractor trailers from a manufacturing facility or storage facility to the site of the data center. The modules may be configured to be moved on and/or off the tractor trailers using a crane or a forklift, or alternatively by wheels attached to the module. One example information handling system configured as a modular data center is shown in FIG. 2.

Figure 2:
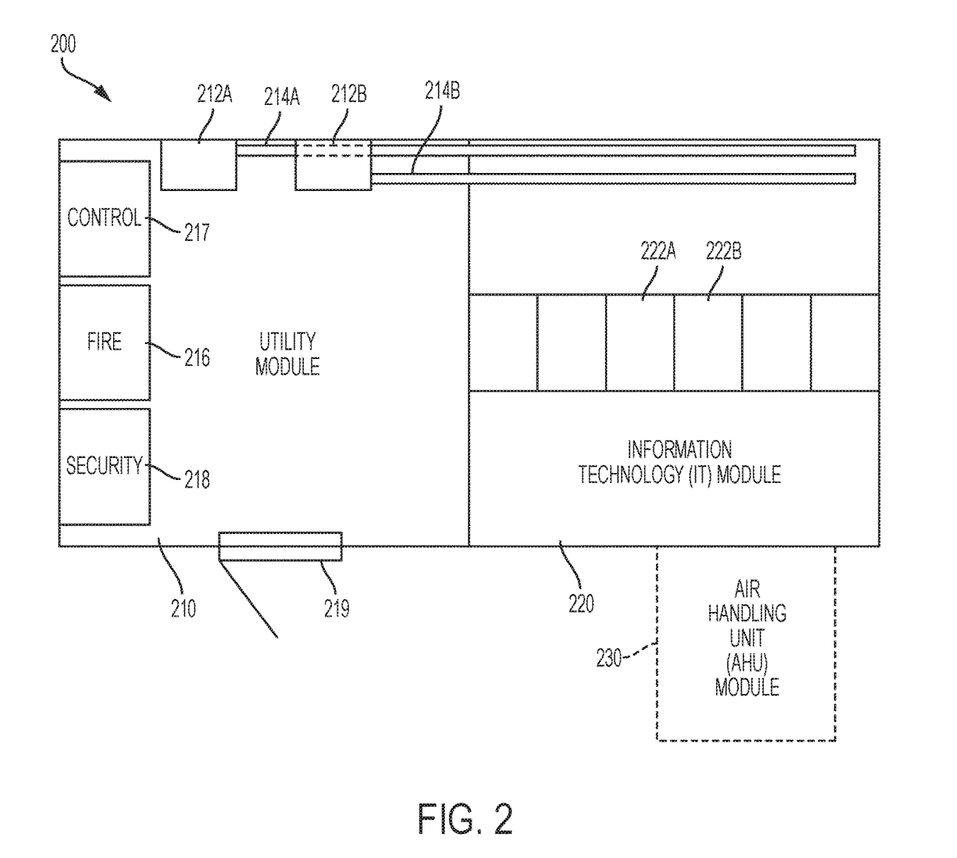
FIG. 2 is a block diagram illustrating a modular equipment space for information handling systems according to one embodiment of the disclosure.

FIG. 2 is a block diagram illustrating a modular equipment space for information handling systems according to one embodiment of the disclosure. A modular data center 200 may house an information handling system in several modules. A utility module 210 may be connected to an information technology (IT) module 220, which is connected to an air handling unit (AHU) module 230. The IT module 220 may include racks 222 (e.g., racks 222A and 222B) that house computer systems, network equipment, other electronic equipment configured to compute, calculate, determine, classify, process, transmit, receive, retrieve, originate, switch, store, display, communicate, manifest, detect, record, reproduce, handle, or utilize any form of information, intelligence, or data for business, scientific, control, or other purposes, and electronic equipment that supports these systems. The space within IT module 220 may be conditioned to desired temperature and humidity levels by an air handling unit (AHU) module 230. The AHU module 230 may include a cooling system, such as a direct cooling or evaporative cooling system, and/or a mixing chamber for mixing cooled air, return air, and/or outside air to obtain the desired temperature and humidity levels.

Equipment in the IT module 220 and the AHU module 230 may be supported by utility infrastructure and other equipment inside a utility module 210. For example, the utility module 210 may include utility infrastructure such as a fire suppression system 216, a control system 217, and/or a security system 218. The utility module 210 and the IT module 220, or other modules not shown, may include connections that allow the modules to be placed next to each other on a site location and quickly connected. The connections may be standardized or common ports that accept a cable for connecting to another module, in which the cable may include several sub-cables or sub-connections that provide access to shared functions from other modules, such as power and data connectors. Thus, the modules may be quickly connected together without modifying equipment contained within the utility module 210 and the IT module 220. The fire suppression system 216, the control system 217, and the security system 218, may be coupled to these connections from the utility module 210 to the IT module 220. When the IT module 220 is connected through the connection to the utility module 210, cameras (not shown) within the IT module 220 may be connected to the security system 218 simultaneously with other systems through the connection. In one embodiment, a single connection between the utility module 210 and IT module 220 may include electrical power connections such as AC mains lines, security wiring such as CCTV wiring, control systems wiring such as low voltage DC lines, and fire suppression lines such as Halon or water lines. In other embodiments, multiple connections or multiple cables may extend from the utility module 210 to other modules.

The control system 217 may include, for example a server system and/or a programmable logic controller (PLC) configured to support the modular data center. For example, the control system 217 may monitor a status of utility infrastructure, including power sources 212A and 212B, and may monitor a status of security systems 218, including recording surveillance video and logging access to secure areas. The control system 217 may also include alerting functionality to alert an administrator through messages, such as e-mail messages or text messages, regarding status updates based on predefined rules and/or when errors occur. The control system 217 may also include firmware and/or software configured to perform operations described throughout this application, including operations described with reference to FIG. 6 below.

In some embodiments, the control system 217 may control the reconfiguration of utility services within the utility module 210 to allow installation of new modules. For example, the control system 217 may be configured to perform steps including providing electrical power, by a power system in a utility module, to information handling systems in a first information technology (IT) module; receiving, by the utility module, an indication of installation of a second information technology (IT) module comprising additional information handling systems; and/or reconfiguring, by the utility module, the power system to support the second information technology (IT) module without interrupting power to the first information technology (IT) module. In some embodiments, the step of reconfiguring the power system may include the steps of de-energizing the first electrical bus; coupling the second information technology (IT) module to the first electrical bus; energizing the first electrical bus; de-energizing the second electrical bus; coupling the second information technology (IT) module to the second electrical bus; and energizing the second electrical bus.

The utility module 210 may also provide a staging area of new or replacement IT equipment prior to installation of the IT equipment within the IT module 220. For example, a door 219 may allow access to the environment within the utility module 210 such that an administrator can operate systems 216, 217, and 218. A portion of utility module 210 may also remain clear to allow delivery of IT equipment. The IT equipment may then be allowed to acclimate to the conditions within utility module 210 and IT module 220 prior to installation in IT module 220. The IT equipment may be un-boxed and de-trashed within the utility module 210 in a space protected from the external environment.

The utility module 210 may provide electrical power service infrastructure through two or more redundant power sources. Power sources 212 (e.g., power sources 212A and 212B) may provide connections to power grids outside of the utility module, such as by connecting to the local electrical service provider, a generator, a solar panel array, and/or a battery. Providing multiple power sources 212 may reduce the likelihood of a power outage affecting services provided by the IT module 220. The power sources 212 may provide power to the IT module and other modules through busses 214 (e.g., bus 214A and 214B). In some embodiments, each power source may have a corresponding bus to connect the power source to the IT module 220. For example, bus 214A may couple the power source 212A to the IT module 220 through the connection between the IT module 220 and the utility module 210 and bus 214B may couple the power source 212B to the IT module 220 through the connection between the IT module 220 and the utility module 210.

Figure 3:
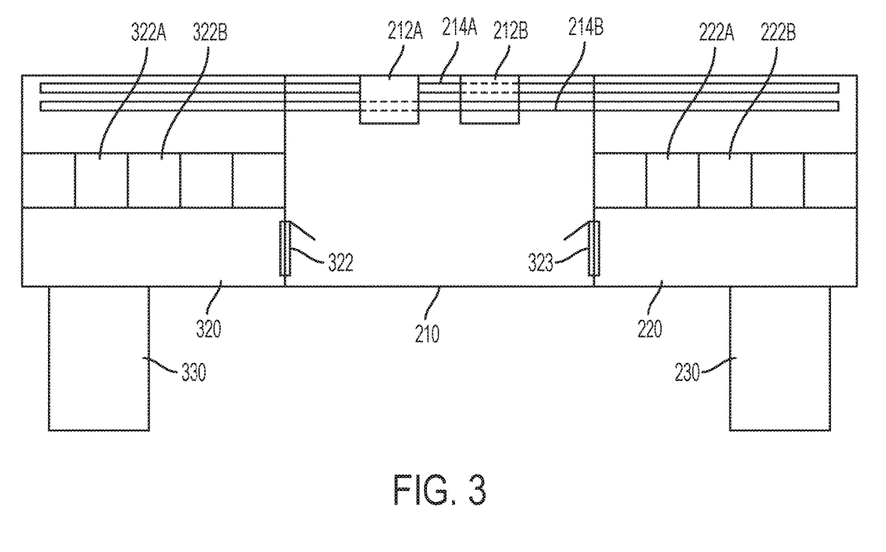
FIG. 3 is a block diagram illustrating expansion of a modular equipment space for information handling systems according to one embodiment of the disclosure.

Although FIG. 2 shows one IT module 220 connected to the utility module 210, additional IT modules may be connected and share support systems provided by the utility module 210. For example, FIG. 3 shows a utility module with two IT modules. FIG. 3 is a block diagram illustrating expansion of a modular equipment space for information handling systems according to one embodiment of the disclosure. As demand on an information handling system increases, the information handling system may be expanded by bringing on-line additional computer systems and other support equipment by adding IT modules and/or other modules. Further, IT modules may include pre-drilled holes, pre-placed racks, and/or pre-wired additional data and power ports for quick installation of additional IT equipment to replace equipment and/or expand functionality. An IT module 320 with racks 322 (e.g., racks 322A and 322B) may be connected to the utility module 210 at a time after IT module 220 was installed. A second connection may connect the IT module 320 to the utility module 210, and that second connection may be similar to the connection to the IT module 220 that allows the modules to be placed next to each other on a site location and quickly connected. In some embodiments, after existing IT module 220 is reaching capacity limits, a truck may deliver the new IT module 320 to the site location of utility module 210 and a single connection made between the new IT module 320 and the utility module 210 without an administrator needed to adjust wiring within the utility module 210 or equipment within the IT module 320. The IT module 320 may be connected to a new AHU module 330 for conditioning space inside the IT module 320, or the IT module 320 may share AHU module 230 with IT module 220. In some embodiments, additional IT modules may also be added on the ends of IT modules 220 and 320 to build a chain of IT modules that share utility module 210. Additional utility modules may also be added in the chain as needed to support the IT modules. In some embodiments, additional IT modules may also be connected directly to the utility module 210, such as in a star configuration of IT modules around the utility module 210.

The utility module 210 may also provide access to IT equipment within the IT modules 220 and 320. For example, doors 322 and 323 may provide access for an administrator to access the IT equipment to perform repairs, replacements, or upgrades. An administrator may have new IT equipment delivered into space within the utility module 210 through a door to the external environment from the utility module, where the IT equipment may be unpackaged and de-trashed in a protected, conditioned environment. The administrator may then access IT modules 220 and 320 through doors 323 and 322, respectively, to install new IT equipment. After installation, the IT equipment may function as part of the information handling system.

Figure 4:
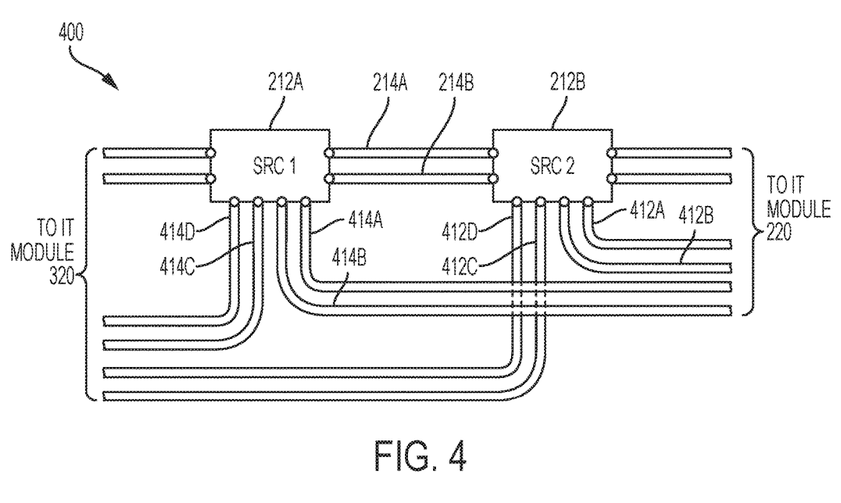
FIG. 4 is a block diagram illustrating an electrical system of a utility module for providing power to one or more information technology (IT) modules according to one embodiment of the disclosure.

One embodiment of an electrical power service infrastructure with redundant sources and busses for a utility module 210 is shown in FIG. 4. FIG. 4 is a block diagram illustrating an electrical system of a utility module for providing power to one or more information technology (IT) modules according to one embodiment of the disclosure. Electrical power service infrastructure 400 may include the power sources 212A and 212B. The power sources 212A and 212B may be actual power sources or connections to external power sources, such as a local electrical grid. In some embodiments, power may be delivered from the power sources 212A and 212B through multiple wirings, including a fixed power system and a variable power system. Distribution of power through a fixed power system may supply power from the power sources 212A and 212B to relatively fixed loads, such as air handling systems, air conditioners, and the like. Distribution of power through a variable power system may supply power from the power sources 212A and 212B to relatively variable loads, including equipment, such as computer systems, in information handling systems stored in racks 222A and 222B of IT module 220. The busses 214A and 214B may operate independently to distribute power in a variable power system and supply redundant power to IT equipment. Bus 214A may be coupled to power source 212A and supply power to IT equipment in one or more IT modules. Bus 214B may be coupled to power source 212B and supply power to IT equipment in one or more IT modules. The busses 214A and 214B may span a length from a utility module to one or more IT modules. Should either of the power sources 212A or 212B lose power, the redundant power of busses 214A and 214B may reduce or eliminate the likelihood of loss of service within the IT modules. Likewise, a fixed power system may provide redundant power to fixed loads. For example, power source 212A may include two conduits 414A and 414B going to a first destination, such as a first IT module, and may include two conduits 414C and 414D going to a second destination, such as a second IT module. Although two conduits are shown going to two destinations, additional or fewer conduits or additional or fewer destinations may be implemented in different embodiments. Redundancy of the power source 212A may be provided by the power source 212B. The power source 212B may also provide two conduits 412A and 412B going to a first destination, such as a first IT module, and may include two conduits 412C and 412D going to a second destination, such as a second IT module. In some embodiments, a first mechanical connection from the utility module 210 to the IT module 220 may include the busses 214A-B and conduits 412A-B and 414A-B, and a second mechanical connection from the utility module to an additional IT module may include the busses 214A-B and conduits 412C-D and 414C-D.

Figure 5:
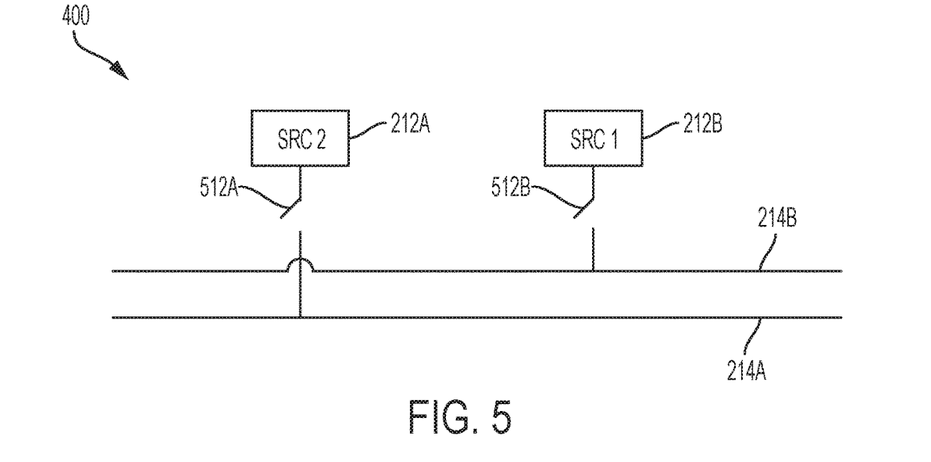
FIG. 5 is a wiring diagram illustrating an electrical system with redundant busses for providing power to one or more information technology (IT) modules according to one embodiment of the disclosure.

The power sources 212A and 212B may be coupled to the busses 214A and 214B through switches to allow reconfiguration of equipment attached to the busses 214A and 214B. One embodiment of reconfigurable busses is shown in FIG. 5. FIG. 5 is a wiring diagram illustrating an electrical system with redundant busses for providing power to one or more information technology (IT) modules according to one embodiment of the disclosure. In some embodiments, electrical power service infrastructure 400 may include a switch 512A that couples the power source 212A to the bus 214A and may include a switch 512B that couples the power source 212B to the bus 214B. The switches 512A and 512B may be toggled to energize or de-energize the busses 214A and 214B, respectively. Toggling of the switches 512A and 512B may be performed to temporarily de-energize the busses 214A and 214B to allow changes in IT equipment configurations powered by the busses 214A and 214B. For example, when a new IT module is attached to the utility module 210 the switches 512A and 512B may be operated to allow coupling of one or more new IT modules to the electrical power service infrastructure 400 without interrupting service to the existing one or more IT modules.

Figure 6:
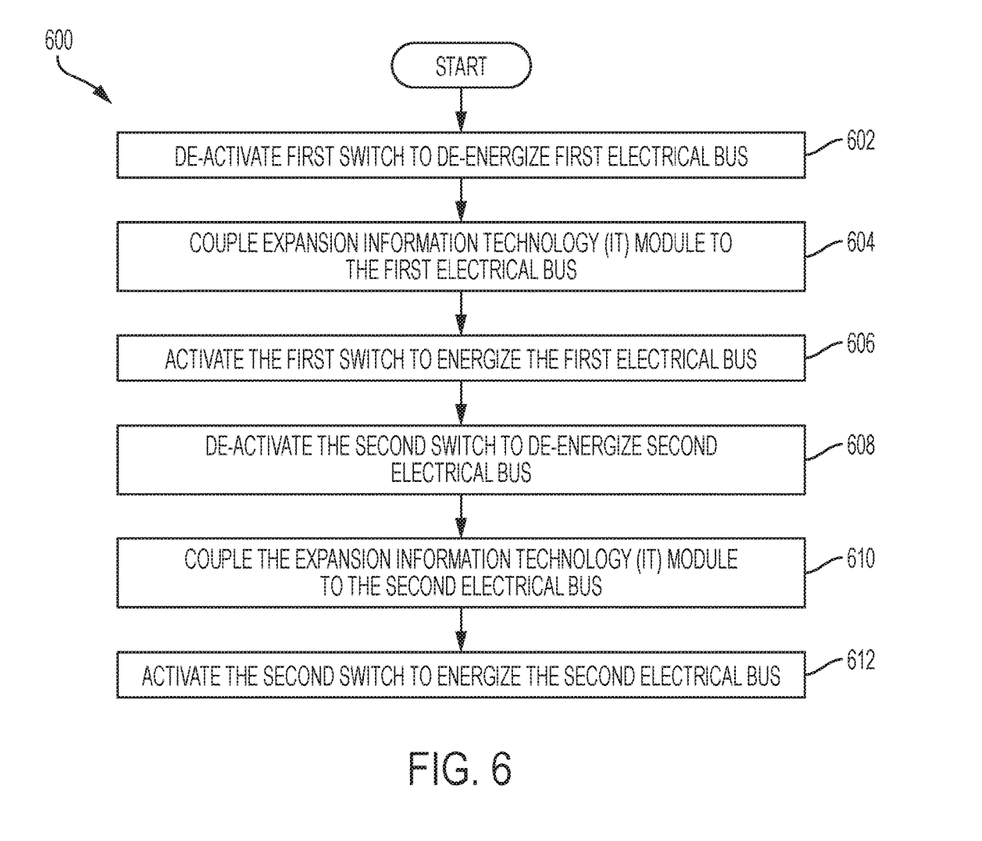
FIG. 6 is a flow chart illustrating a method of expanding an information handling system with new information technology (IT) modules according to one embodiment of the disclosure.

One example operation of the switches 512A and 512B to allow reconfiguration to support one or more new IT modules is described with reference to FIG. 6. FIG. 6 is a flow chart illustrating a method of expanding an information handling system with new information technology (IT) modules according to one embodiment of the disclosure. A method 600 begins at block 602 with de-activating a first switch to de-energize a first electrical bus. While the first electrical bus is de-energized the second electrical bus remains energized to supply power to existing IT modules. At block 604, an expansion IT module (e.g., a new IT module) may be coupled to the first electrical bus, which was de-energized at block 602 to allow for reconfiguration of the first electrical bus to include the expansion IT module. Next, at block 606 the first switch is activated to re-energize the first electrical bus with power to operate the existing and expansion IT modules.

With the first electrical bus reconfigured to provide power to the existing and expansion IT modules, similar steps may be performed to reconfigure a second bus to support the existing and expansion IT modules. At block 608, the second switch is de-activated to de-energize the second electrical bus. While the second electrical bus is de-energized the first electrical bus remains energized to supply power to the existing and expansion IT modules. At block 610, the expansion IT module (e.g., the new IT module) may be coupled to the second electrical bus, which was de-energized at block 608 to allow for reconfiguration of the second electrical bus to include the expansion IT module. Next, at block 612, the second switch is re-activated to energize the second electrical bus. Then, the existing IT modules and the expansion IT modules are both operating from the two electrical busses in a redundant fashion. If additional electrical busses are provided for further redundancy in power sources, the method 600 may continue in a similar manner to reconfigure the additional busses to support the expansion IT modules.

Figure 7:
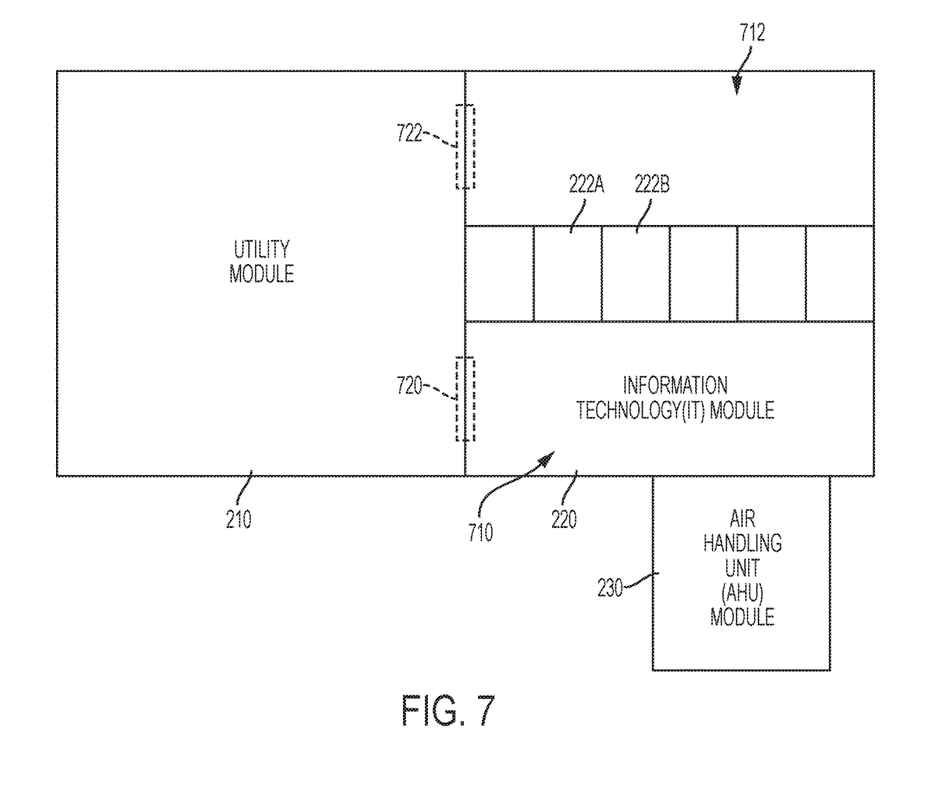
FIG. 7 is a block diagram illustrating a modular equipment space with passive cooling of a utility module according to one embodiment of the disclosure.

In some embodiments, the utility module 210 may include a dedicated air handling unit (AHU) module or other air conditioning unit, such as a dedicated direct cooling system. In other embodiments, the utility module 210 may be configured to obtain passive cooling from another module, such as the IT module 220. FIG. 7 is a block diagram illustrating a modular equipment space with passive cooling of a utility module according to one embodiment of the disclosure. Passive cooling of the utility module 210 may be obtained by providing openings between the utility module 210 and the IT module 220 to allow airflow through the utility module 210 to and/or from the IT module 220. For example, two openings 720 and 722 allow airflow between the utility module 210 and the IT module 230. The two openings 720 and 722 may provide airflow access to different spaces within the IT module 220. Although specific openings are illustrated for the module configurations discussed herein. Openings for the utility module 210 may be configured to match a configuration of the IT module 220. As such, the openings may be located on any side and may include dampers that allow for opening and/or closing the openings.

The space within the IT module 220 may be divided into sections by the racks 222A and 222B, including a cold aisle 710 and a warm aisle 712. The cold aisle 710 receives cold air from the AHU module 230, which filters through the racks 222A and 222B to cool computer systems and other equipment that are part of the information handling system, to arrive at the warm aisle 712. Air may be removed from the warm aisle and recirculated through the AHU module 230 and again into the cold aisle 710. The cold aisle 710 may be at a slightly higher pressure than the warm aisle 712. Although aisles are described, spaces within the IT module 220 may be divided in other manners. In some embodiments, the openings 720 and 722 may be located between the utility module 210 and the IT module 220 at locations that provide access to the cold aisle 710 and warm aisle 712, respectively. Cool air thus flows from the AHU module 230 to the IT module 220, to the opening 720, through the utility module 210, to the opening 722, to the warm aisle 712, and is exhausted or recycled.

Figure 8:
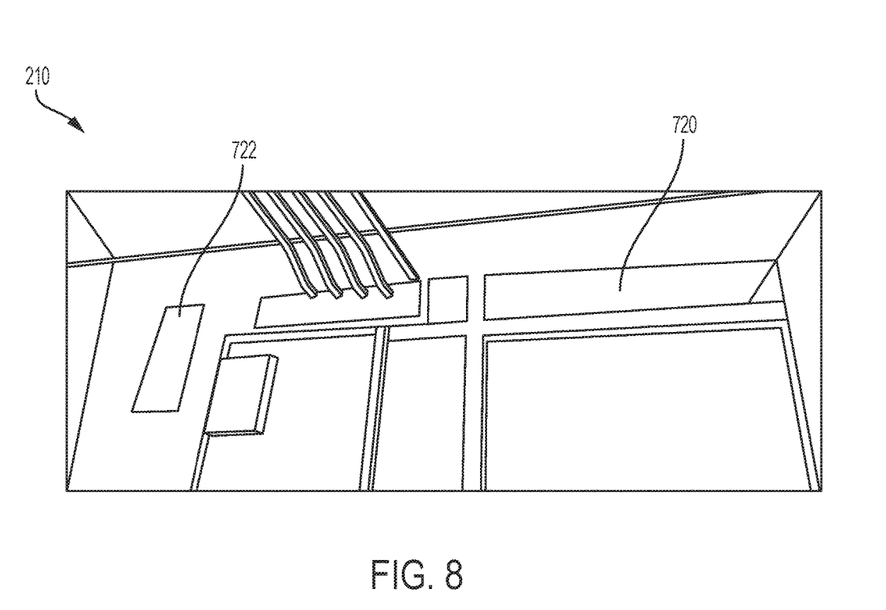
FIG. 8 is a perspective view of a wall of a utility module with openings for passive cooling of the utility module according to one embodiment of the disclosure.

The openings 720 and 722 of some embodiments may be located along a wall to provide airflow access to two different spaces within the IT module 220. For example, the openings 720 and 722 may be placed to fit around other equipment present in the utility module 210. One example embodiment for placement of the openings 720 and 722 is shown in FIG. 8. FIG. 8 is a perspective view of a wall of a utility module with openings for passive cooling of the utility module according to one embodiment of the disclosure. The utility module 210 space is shown with the two openings 720 and 722 on a wall bordering the IT module 220. In some embodiments, the openings 720 and 722 may include dampers or shutters (not shown) to allow restricting airflow to the utility module 210 and/or shutting off airflow to the utility module 210, so that an independent temperature may be maintained in the utility module 210 separate from the temperature of the IT module 220. The openings may also include other components to facilitate airflow and maintain a quality of the air, such as fans and/or filters.

Although the openings 720 and 722 are both shown in the above embodiments between the IT module 220 and the utility module 210, the openings may provide airflow to different spaces. Airflow may be achieved through the utility module 210 when the openings 720 and 722 provide openings to two regions of different pressures. In one embodiment, the regions with different pressures may be the warm aisle 712 and the cold aisle 710. However, in some embodiments, the opening to a space of lower pressure may be other spaces, such as an exhaust to unconditioned air or other space outside the modules 210, 220, and 230. Further, in some embodiments, the opening to a space of higher pressure may be other spaces, such as a conditioned and/or cooled space in a different module.

Passive cooling of the utility module 210 may provide significant cost savings over a lifetime of the information handling system. For example, providing direct cooling of the utility module 210 through a dedicated air handling system may involve an upfront equipment cost of $10-20 k. By using passive cooling, that equipment cost may be avoided. The AHU module 230 attached to IT module 220 often has additional cooling capacity that can be used for utility module 210 without requiring an increase in size and/or cost of the AHU module 230. Further, the cost of electricity of a dedicated air handling system for the utility module 210 may be up to $1000 per year of operation. Still further, the cost of maintenance of the dedicated air handling unit for the utility module 210 adds further expenses. Thus, cost savings through passive cooling of the utility module 210 may be as much as or more than $30 k.

Figure 9A:
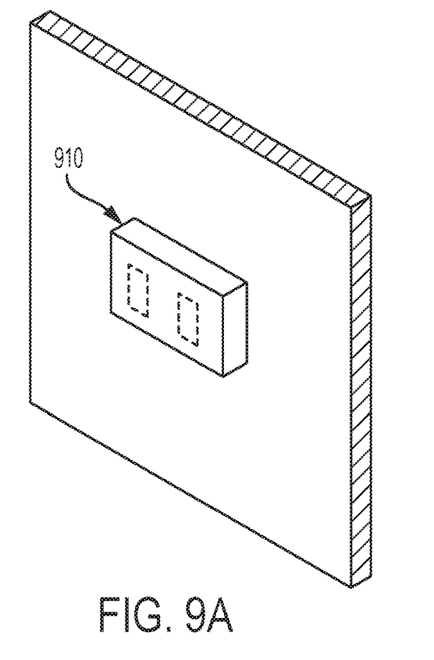
FIGS. 9A-B are perspective views of an electrical box with openings for passive cooling of the enclosed space within the electrical box according to one embodiment of the disclosure.
Figure 9B:
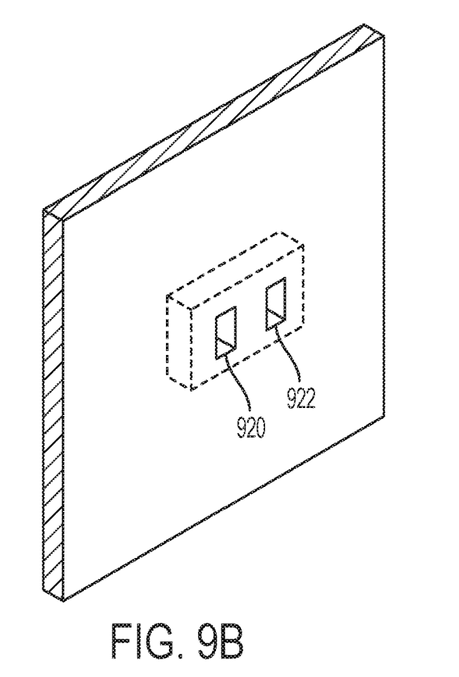

Passive cooling may be used to cool other enclosed spaces other than the utility module. For example, passive cooling may be used to cool an electrical box. FIGS. 9A-B are perspective views of an electrical box with openings for passive cooling of the enclosed space within the electrical box according to one embodiment of the disclosure. FIG. 9A is a front view of the electrical box; and FIG. 9B is a back view of the electrical box showing openings 920 and 922 between an enclosed space 910 and a cool and/or high pressure space and a warm and/or low pressure space, respectively. As with passive cooling for the utility room, the openings 920 and 922 for the enclosed space 910 may be configured to align with an IT module or any other module with conditioned air. The enclosed space 910, such as an electrical box, may also be located external to the modules, such as when the electrical box is attached to an outside of a module, such as the IT module. In one embodiment of such a configuration, one opening may provide airflow to an interior conditioned space and one opening may provide airflow to an exhaust area or external environment. The enclosed space 910 of the electrical box may contain electrical components that generate heat and raise a temperature of the enclosed space 910. The elevated temperatures may require cooling of the enclosed space 910 to maintain desired operation and/or to meet certain building codes. Passive cooling of the enclosed space 910 may thus reduce costs associated with the installation and maintenance of the electrical box or other enclosed spaces requiring cooling or heat dissipation.

The schematic flow chart diagram of FIG. 6 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   a first prefabricated infrastructure module (PIM) of a modular data center, the first module being configured to provide at least one function to other modules of the modular data center, comprising:
   a first connection configured to couple the first module to a second prefabricated infrastructure module (PIM) comprising information handling systems;
   a second connection configured to couple the first module to a third prefabricated infrastructure module (PIM) comprising additional information handling systems;
   utility infrastructure, including electrical power service infrastructure, configured to provide utilities, including electrical power service, to the second module and the third module through the first connection and the second connection, and wherein the utility infrastructure is configured to allow the first module to connect to the third module and to begin providing electrical power service to the third module without interrupting the provision of electrical power service to the second module;
   access to equipment located in the second module; and
   a controlled space for staging new equipment for installation in the second module.

2. The apparatus of claim 1, in which the electrical power service infrastructure comprises:
   a first input node for a first electrical source;
   a second input node for a second electrical source;
   a first electrical bus configured to couple the second module and the third module to the first input node;
   a second electrical bus configured to couple the second module and the third module to the second input node;
   a first switch coupled to the first electrical bus and to the first input node; and
   a second switch coupled to the second electrical bus and to the second input node.

3. The apparatus of claim 2, in which the electrical power service infrastructure comprises a control unit configured to support connecting of the third module at the second connection by performing steps comprising:
   de-activating the first switch to de-energize the first electrical bus;
   coupling the third module to the first electrical bus;
   activating the first switch to energize the first electrical bus;
   de-activating the second switch to de-energize the second electrical bus;
   coupling the third module to the second electrical bus; and
   activating the second switch to energize the second electrical bus.

4. The apparatus of claim 1, in which the first module further comprises:
   access to at least one of the information handling systems and the additional information handling systems; and
   a controlled space for staging new information handling systems for installation with at least one of the information handling systems and the additional information handling systems.

5. The apparatus of claim 1, wherein the first module further comprises a fire suppression system configured to couple to the second module and the third module.

6. The apparatus of claim 1, wherein the first module further comprises a low-voltage direct current (DC) control bus configured to couple to the second module and the third module.

7. The apparatus of claim 1, wherein the first module further comprises a security system configured to couple to the second module and the third module.

8. An information handling system, comprising:
   a plurality of prefabricated infrastructure modules (PIMs), the plurality of modules comprising:
   a first information technology (IT) module comprising equipment for information handling;
   an air handling unit (AHU) module coupled to the first information technology (IT) module; and
   a utility module, comprising:
   a first connection configured to couple the utility room to the first information technology (IT) module;
   a second connection configured to couple the utility room to a second information technology (IT) module;
   utility infrastructure, including electrical power service infrastructure, configured to provide utilities to the first information technology (IT) module and the second information technology (IT) module through the first connection and the second connection, and wherein the utility infrastructure is configured to allow the utility room to connect to the second information technology (IT) module and to begin providing electrical power service to the second information technology (IT) module without interrupting the provision of electrical power service to the first information technology (IT) module;

access to equipment located in the first information technology (IT) module; and a controlled space for staging new equipment for installation in the first information technology (IT) module.

9. The system of claim 8, in which the electrical power service infrastructure comprises:

a first input node for a first electrical source; a second input node for a second electrical source;

a first electrical bus configured to couple the first information technology (IT) module and the second information technology (IT) module to the first input node;

a second electrical bus configured to couple the first information technology (IT) module and the second information technology (IT) module to the second input node;

a first switch coupled to the first electrical bus and to the first input node; and a second switch coupled to the second electrical bus and to the second input node.

10. The system of claim 9, in which the electrical power service infrastructure comprises a control unit configured to support connecting of the second information technology (IT) module at the second connection by performing steps comprising:

de-activating the first switch to de-energize the first electrical bus;

coupling the third module to the first electrical bus;

activating the first switch to energize the first electrical bus;

de-activating the second switch to de-energize the second electrical bus;

coupling the third module to the second electrical bus; and activating the second switch to energize the second electrical bus.

11. The system of claim 8, wherein the utility module further comprises a fire suppression system configured to couple to the first information technology (IT) module and the second information technology (IT) module.

12. The system of claim 8, wherein the utility module further comprises a low-voltage direct current (DC) control bus configured to couple to the first information technology (IT) module and the second information technology (IT) module.

13. The system of claim 8, wherein the utility module further comprises a security system configured to couple to the first information technology (IT) module and the second information technology (IT) module.

14. A method, comprising:

providing electrical power, by a power system in a utility prefabricated infrastructure module (PIM), to information handling systems in a first information technology (IT) module;

receiving, by the utility module, an indication of installation of a second information technology (IT) module comprising additional information handling systems; and reconfiguring, by the utility module, the power system to support the second information technology (IT) module without interrupting power to the first information technology (IT) module.

15. The method of claim 14, wherein the step of providing electrical power comprises providing electrical power through a first electrical bus and a second electrical bus coupled to the first information technology (IT) module and configured to operate redundantly.

16. The method of claim 15, wherein the step of reconfiguring the power system comprises:

de-energizing the first electrical bus;

coupling the second information technology (IT) module to the first electrical bus;

energizing the first electrical bus;

de-energizing the second electrical bus;

coupling the second information technology (IT) module to the second electrical bus; and energizing the second electrical bus.

17. The method of claim 14, further comprising expanding the information handling systems by adding the second the second information technology (IT) module, wherein the step of reconfiguring is performed to add additional capacity to the information handling systems.

* * * * *